United States Patent
Lee et al.

(10) Patent No.: US 7,206,219 B2
(45) Date of Patent: Apr. 17, 2007

(54) SLAVE AND MASTER OF SERIAL PERIPHERAL INTERFACE, SYSTEM THEREOF, AND METHOD THEREOF

(75) Inventors: Yu-Chu Lee, Jhubei (TW); Sheng-Ping Chen, Sinjhuang (TW); Chien-Yu Lin, Sanchong (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 69 days.

(21) Appl. No.: 11/197,851

(22) Filed: Aug. 5, 2005

(65) Prior Publication Data
US 2006/0239104 A1    Oct. 26, 2006

(30) Foreign Application Priority Data
Apr. 26, 2005    (TW) ................. 94113196 A

(51) Int. Cl.
*G11C 11/00*    (2006.01)
(52) U.S. Cl. ............ 365/154; 365/230.01; 365/230.06; 365/230.08; 365/185.33
(58) Field of Classification Search ................. 365/154, 365/230.01, 230.06, 230.08, 185.33
See application file for complete search history.

(56) References Cited

U.S. PATENT DOCUMENTS 4,902,909 A * 2/1990 Chantepie ................... 327/115
5,748,522 A * 5/1998 Piguet et al. ................ 365/154

* cited by examiner

*Primary Examiner*—Richard T. Elms
*Assistant Examiner*—N Nguyen
(74) *Attorney, Agent, or Firm*—J.C. Patents

(57) ABSTRACT

A slave and a master of serial peripheral interface, system thereof and method thereof are provided. The invention saves the read address during the process of data-read in the serial peripheral interface (SPI) and adds a new data-read command so that when the former data address is followed by the next one, the transmission of the read address is ignored by using new read command in order to increase the efficiency of data read in the serial peripheral interface.

15 Claims, 3 Drawing Sheets

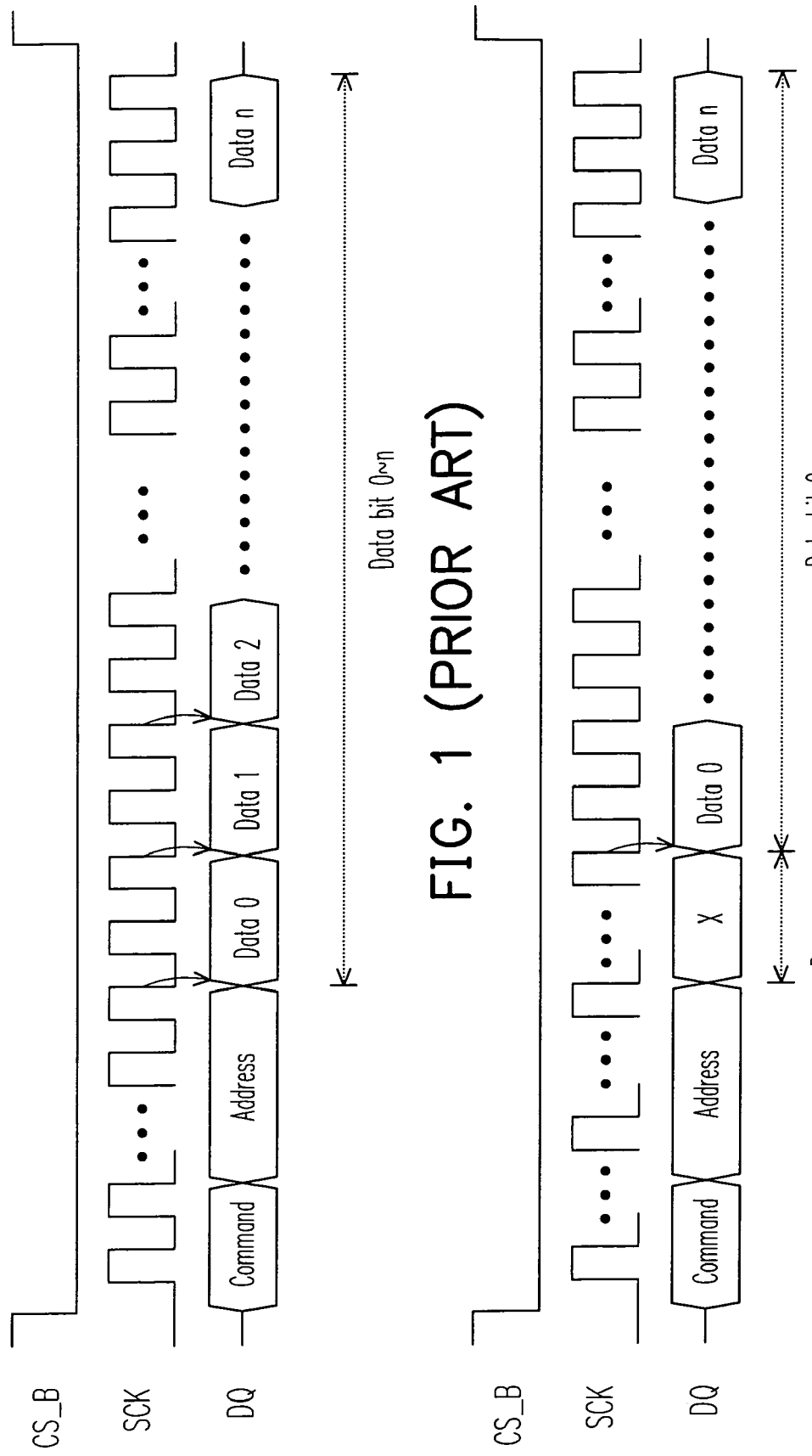

SLAVE AND MASTER OF SERIAL PERIPHERAL INTERFACE, SYSTEM THEREOF, AND METHOD THEREOF

CROSS-REFERENCE TO RELATED APPLICATION

This application claims the priority benefit of Taiwan application serial no. 94113196, filed on Apr. 26, 2005. All disclosure of the Taiwan application is incorporated herein by reference.

BACKGROUND OF THE INVENTION

1. Field of the Invention

The present invention relates to an apparatus and a method for a serial peripheral interface, and more particularly, to a slave and a master of a serial peripheral interface, a system thereof, and a method thereof, in which the transmission of the read address is can be saved.

2. Description of the Related Art

The parallel peripheral interface of the address and data bus is commonly used as an access interface for the flash memory. However, such interface uses a great number of pins, which is costly in packaging chips. In order to reduce the number of pins in the chip, several methods have been applied. Among them, the serial peripheral interface (abbreviated as SPI hereinafter) is commonly adopted in the industry.

FIG. 1 schematically shows a waveform diagram illustrating the timing of performing a read operation on a conventional SPI. The SPI structure complied with the standard specification uses a serial clock signal line (SCK) and a serial transmission data line (DQ) to transmit data. Referring to the waveform in FIG. 1, wherein SCK is a serial clock signal on the serial clock signal line, DQ is a line signal on the serial transmission data line, and CS_B is an enable signal. The SPI standard defines a specific transmission protocol, in which a master of SPI is triggered on every positive edge of the clock based on the serial clock signal SCK in order to transmit command and address on the serial transmission data line (DQ). Similarly, a slave of SPI is triggered on every negative edge of the clock based on the serial clock signal SCK to send back the data on the serial transmission data line (DQ).

FIG. 2 schematically shows a waveform diagram illustrating the timing of performing a fast read operation on a conventional SPI. Wherein, the command and the address on the serial transmission data line (DQ) are still transmitted on the positive edge trigger of the serial clock signal SCK. However, since the frequency of the serial clock signal SCK is too high in such case, when the slave of SPI sends back the data, one or more dummy data cycles are added in order to accurately read data and to ensure data can be accurately and promptly read.

In the prior art, each read process on the SPI comprises: transmitting a command, transmitting an address, and receiving a data. Since the command and address need to be retransmitted every time when the data is read, such design reduces the efficiency of the data read. Especially when performing the fast read command, since the frequency of the transmission clock is too high, one or more dummy data cycles have to be added between the address and data that the data can be accurately and promptly read, which increases transmission time and reduces the transmission efficiency.

SUMMARY OF THE INVENTION

Therefore, it is an object of the present invention to provide a slave of serial peripheral interface (SPI), in which an address register and a pre-fetch data register are added in order to eliminate the unnecessary address transmission and to improve the efficiency of data read or write.

It is another object of the present invention to provide a master of serial peripheral interface (SPI), in which a new continuous read or write command is added to receive and transmit data, such that the unnecessary address transmission is eliminated.

It is yet another object of the present invention to provide a system of serial peripheral interface (SPI), wherein when the data addresses are in sequence, both the transmission of the address and the dummy data cycle are omitted. Accordingly, the efficiency of data read or write is improved.

It is still yet another object of the present invention to provide a method for a serial peripheral interface (SPI), in which the unnecessary address transmission is eliminated and the efficiency of data read is enhanced.

A slave of SPI provided by the present invention comprises a storage apparatus and an SPI decoder. Wherein, the storage apparatus provides a data. The SPI decoder electrically coupled to the storage apparatus comprises a storage apparatus controller, an address register, and a decoder. The storage apparatus controller controls the operation of the storage apparatus, and the address register stores a memory address. In addition, the decoder decodes a serial command received via the SPI. When the serial command equals a continuous read command, the SPI decoder reads a data from the storage apparatus based on the memory address and transmits the data to the SPI in a format complied with the SPI specification. Wherein, the SPI decoder adds the last read address to a next record of address and updates it to the address register.

In the slave of SPI according to the preferred embodiment of the present invention, the SPI decoder mentioned above further comprises a pre-fetch data register. The SPI decoder reads the data from the storage apparatus based on the next record of address updated to the address register and stores the data into the pre-fetch data register.

In the slave of SPI according to the preferred embodiment of the present invention, the SPI decoder mentioned above decodes the serial command. When the serial command equals the continuous read command, the SPI decoder writes the data received via the SPI to the storage apparatus based on the memory address. Wherein, the storage apparatus is a flash memory.

The present invention further provides a master of SPI, and the master of SPI comprises a micro controller unit and an SPI controller. Wherein, the micro controller unit provides a read address and receives a read data. The SPI controller electrically coupled to the micro controller unit comprises an address register, a comparator, and an encoder. The address register stores a reference address. The comparator electrically coupled to the address register compares the read address with the reference address and outputs a comparison value. In addition, when the former data address is followed by a next one, the encoder electrically coupled to the comparator generates a continuous read command based on the received comparison value, and the SPI controller transmits the continuous read command to the SPI and then waits for the read data to return. After the read data is returned, the SPI controller transmits the read data to the micro controller unit. After the addresses are compared, the SPI controller updates the address register based on the read address provided by the micro controller unit.

In the master of SPI according to the preferred embodiment of the present invention, the micro controller unit mentioned above provides a write address and transmits a write data. The comparator compares the write address with the reference address and outputs a comparison value to the encoder.

In the master of SPI according to the preferred embodiment of the present invention, the encoder mentioned above generates the continuous read command based on the received comparison value, and the SPI controller transmits the continuous read command to the SPI. Here, the continuous read address is followed by the write data provided by the micro controller unit.

A system of serial peripheral interface (SPI) provided by the present invention comprises an SPI, a master of SPI, and a slave of SPI. Wherein, the master of SPI comprises a micro controller unit and an SPI controller. The micro controller unit provides a read address and receives a read data. The SPI controller electrically coupled to the micro controller unit comprises a first address register, a comparator, and an encoder. Wherein, the first address register stores a reference address. The comparator electrically coupled to the first address register compares the read address with the reference address and outputs a comparison value. In addition, when the former data address is followed by a next one, the encoder electrically coupled to the comparator generates a continuous read command based on the received comparison value, and the SPI controller transmits the continuous read command to the SPI and then waits for the read data to return. Finally, after the addresses are compared, the SPI controller updates the first address register based on the read address provided by the micro controller unit. The slave of SPI comprises a storage apparatus and an SPI decoder. Wherein, the storage apparatus provides a data. The SPI decoder electrically coupled to the storage apparatus comprises a storage apparatus controller, a second address register, and a decoder. The storage apparatus controller controls an operation of the storage apparatus, and the second address register stores a memory address. In addition, the decoder decodes a serial command received via the SPI. When the serial command equals the continuous read command, the SPI decoder reads a data from the storage apparatus based on the memory address and transmits the data to the SPI in a format complied with the SPI specification. Wherein, the SPI decoder adds the last read address to a next record of address and updates it to the second address register. Finally, when the read data is returned, the SPI controller transmits the read data to the micro controller unit, such that the data read operation is completed.

In the system of SPI according to the preferred embodiment of the present invention, the SPI decoder mentioned above further comprises a pre-fetch data register, and the SPI decoder reads the data from the storage apparatus based on the next record of address in the second address register and stores the data to the pre-fetch data storage.

In the system of SPI according to the preferred embodiment of the present invention, the storage apparatus mentioned above is a flash memory.

The present invention provides a method for operating a serial peripheral interface (SPI). The operating method comprises: storing a memory address; receiving a serial command; decoding the received serial command; when the serial command equals a continuous read command, reading the data based on the memory address and returning the data in a format complied with the SPI specification; and adding a last read address to a next record of address and updating the memory address.

The method for operating the SPI according to the preferred embodiment of the present invention further comprises the following steps: storing a reference address; providing a read address; comparing the read address with the reference address and outputting a comparison value; when the former data address is followed by a next one, generating a continuous read command based on the received comparison value; transmitting the continuous read command and waiting for the read data to return; when the read data is returned, transmitting the read data to where it comes from; and after comparing the addresses, updating the reference address based on the read address.

The method for operating the SPI according to the preferred embodiment of the present invention further comprises the following steps: providing a write address and transmitting a write data; comparing the write address with the reference address and outputting a comparison value; generating a continuous write command based on the received comparison value, transmitting the continuous write command and the write data, wherein the continuous write command is followed by the write data; and when the serial command equals the continuous write command, writing the received write data into the storage apparatus based on the memory address.

In the present invention, since a second address register and a pre-fetch data register are configured on the slave of SPI, a next record of address and data are recorded each time after the data is read. In addition, a new continuous read command is added in order to directly transmit command and receive data without having to transmit the address. Since it only needs to transmit command and receive data each time when reading the data, such design effectively improves the efficiency of data read. Especially in performing the fast read command, the unnecessary dummy data cycles are no longer required, thus data is accurately and promptly read by applying the pre-fetch data register, such that the transmission speed is improved and the transmission efficiency is enhanced.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 1 schematically shows a waveform diagram illustrating the timing of performing a read operation on a conventional SPI.

FIG. 2 schematically shows a waveform diagram illustrating the timing of performing a fast read operation on a conventional SPI.

DESCRIPTION OF THE PREFERRED EMBODIMENTS

Figure 3:
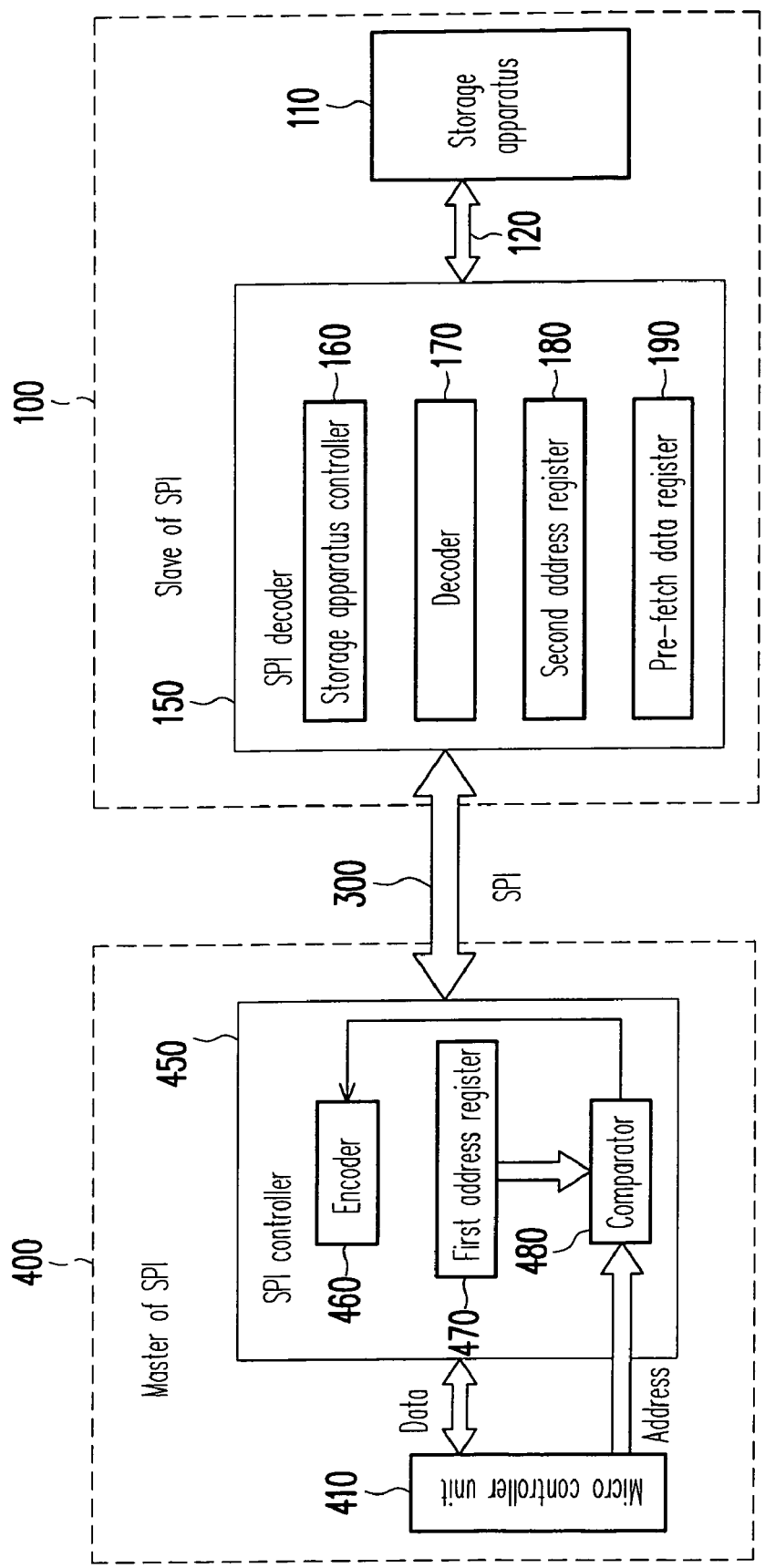
FIG. 3 schematically shows a block diagram of an SPI according to a preferred embodiment of the present invention.

FIG. 3 schematically shows a block diagram of an SPI according to a preferred embodiment of the present invention. Referring to FIG. 3, the SPI shown in the diagram comprises three major parts: a slave of SPI 100, an SPI 300 and a master of SPI 400. Wherein, the slave of SPI 100 comprises an SPI decoder 150 and a storage apparatus 110.

The storage apparatus 110 may be not included in the slave of SPI 100; instead, it can be externally connected to the salve of SPI 100 based on the physical requirement. In addition, the storage apparatus 110 is included in the present invention and is a flash memory.

The SPI decoder 150 in the slave of SPI 100 comprises a storage apparatus controller 160, a decoder 170 and a second address register 180. Wherein, the second address register 180 stores a memory address. The storage apparatus controller 160 controls the data access from the storage apparatus 110 and the related address operation. The slave of SPI 100 electrically coupled to the SPI 300 receives a serial command from the SPI 300, and the decoder 170 decodes the serial command received via the SPI 300. When the serial command equals a continuous read command, the SPI decoder 150 reads the data from the storage apparatus 110 based on the memory address and transmits the data to the SPI 300 in a format complied with the SPI specification.

During the fast read operation, since the required clock is shorter, it is required to add one or more dummy data cycles between the address and data, such that the data can be accurately and promptly read. Therefore, in order to avoid such requirement, a pre-fetch data register 190 is further comprised in the embodiment of the present invention, so as to ensure the dummy data cycle is no longer generated. In such case, the command is directly transmitted and the data is immediately returned following the command (it is also possible to normally transmit the data without the pre-fetch data register 190 depending on the physical requirement). First, the pre-fetch data register pre-stores a start information of a next record of address, such that when the fast read command is received, the pre-fetch data register 190 can transmit the pre-stored data and read the data from the storage apparatus 110 at the same time. Accordingly, the time spent on the dummy data cycle is effectively eliminated.

When the serial command transmitted by the SPI 300 is a continuous write command, the SPI decoder 150 writes the data received from the SPI 300 to the storage apparatus 110 based on the memory address. Note that although the pre-fetch data register 190 is not used in the data write operation, the address transmission is still eliminated. However, realistically, the write operation is cooperated with the check sum protection for avoiding the error operation (or noise), such that the error data in the storage apparatus is able to be modified or recovered.

The master of SPI 400 comprises a micro controller unit 410 and an SPI controller 450. Wherein, the SPI controller 450 comprises a first address register 470, a comparator 480, and an encoder 460. The micro controller unit 410 performs an operation, provides a read address to the SPI controller 450, and waits for the SPI controller 450 to return the read data.

The comparator 480 in the SPI controller 450 receives the read address provided by the micro controller unit 410, compares the read address with the reference address in the first address register 470, provides a comparison value to the encoder 460, and determine the following processes based on the received comparison value.

When the former data address is followed by the next one, the encoder 460 generates a continuous read command, and the SPI controller 450 transmits the continuous read command to the SPI 300 and waits for the read data to return. After the read data is returned, the SPI controller 450 transmits the read data to the micro controller unit 410.

If the former data address is not followed by the read address provided by the micro controller unit, the conventional read command is transmitted to the SPI 300. Wherein, the read command is followed by the data address, and the read data is expected to be received. Afterwards, the SPI decoder 150 decodes the read command and the read address based on the conventional technique and reads the data from the storage apparatus 110 based on the read address. Finally, the read data is transmitted to the SPI 300 in a format complied with the SPI specification.

If it is required to write data into the storage apparatus, the micro controller unit 410 provides a write address and transmits a write data to the SPI controller 450. The comparator 480 receives the write address, compares the write address with the reference address and provides a comparison value to the encoder 460.

When a continuous write command is generated by the encoder 460 based on the received comparison value, the continuous write command is transmitted to the SPI 300 via the SPI controller 450. Wherein, the continuous write command is followed by the write data provided by the micro controller unit 410. If a conventional write command is alternatively transmitted, then the write command and the write address in immediate follow are transmitted to the SPI 300 based on the conventional technique. And then, the write data are also written to the SPI 300 in immediate follow. A waveform diagram illustrating the timing of the fast read operation is exemplified hereinafter.

Figure 4:
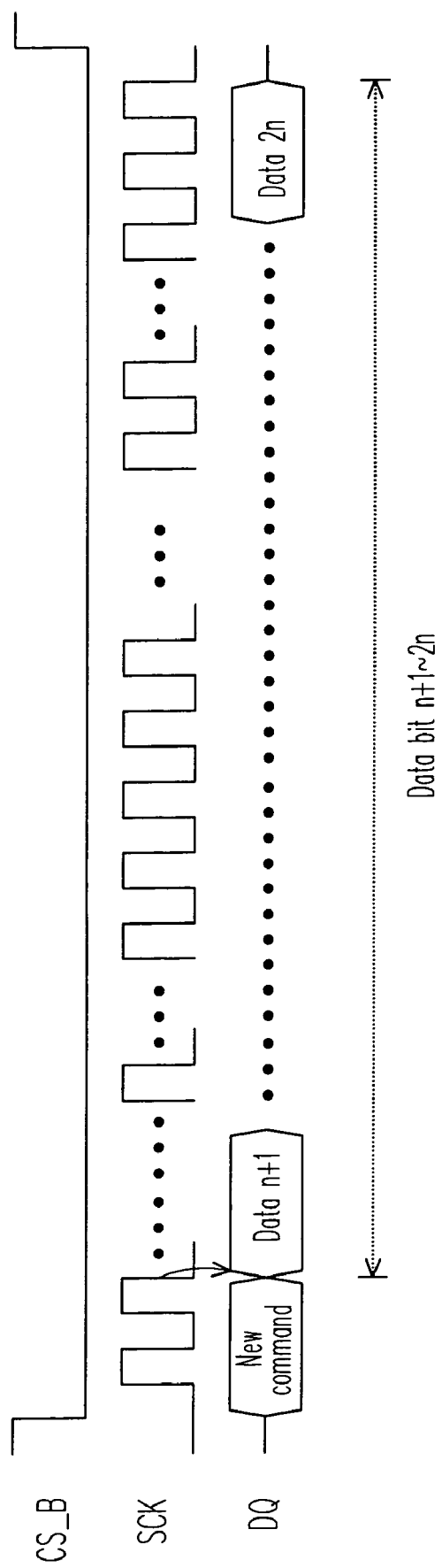
FIG. 4 schematically shows a waveform diagram illustrating the timing of performing a fast read operation on an SPI according to a preferred embodiment of the present invention.

FIG. 4 schematically shows a waveform diagram illustrating the timing of performing a fast read operation on an SPI according to a preferred embodiment of the present invention. Referring to the waveform in FIG. 4, wherein SCK is the serial clock signal on the serial clock signal line, DQ is the line signal on the serial transmission data line, and CS_B is the enable signal. According to the transmission protocol defined by the SPI standard, the master of SPI is triggered on every positive edge of the clock based on the serial clock signal SCK in order to transmit the read command on the serial transmission data line (DQ). Similarly, the slave of SPI is triggered on every negative edge of the clock based on the serial clock signal SCK in order to send the data back on the serial transmission data line (DQ). Comparing with the waveform diagram illustrating the timing of performing a fast read operation on a conventional SPI 300 in FIG. 2, such method eliminates both the transmission of the read address (normally, it is 24 bits) and the unnecessary generation of the dummy data cycles, such that the data can be accurately and promptly read. In the waveform of the data write operation, the address transmission is also eliminated when compared with the conventional technique, thus its detail is omitted herein.

In accordance with the preferred embodiment of the present invention, the method for the SPI provided by the present invention comprises both the read and write operations. One of the ordinary skill in the art should easily understand the method from the embodiment shown above, thus its detail is omitted herein.

In summary, the system of SPI provided by the present invention comprises an SPI 300, a master of SPI 400 and a slave of SPI 100. Since both the characteristics of the read address continuity provided by the micro controller unit and the waste of the dummy data cycle in multiple records of SPI data transmission are considered, a specific command (i.e. a continuous read command) and a data pre-fetch function (i.e. accomplished by adding the pre-fetch data register 190) are both added into the SPI system. In addition, the transmission of the read address is reduced (i.e. accomplished by adding the second address register 180), such that the efficiency of the sequential data read is improved. Especially in performing the fast read command, the unnecessary dummy data cycle is no longer used, and the data can be accurately and promptly read by using the pre-fetch data register 190. Accordingly, the transmission speed is improved and the transmission efficiency is enhanced.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A slave of a serial peripheral interface (SPI), comprising:
    a storage apparatus for providing a data; and
    an SPI decoder electrically coupled to the storage apparatus, comprising:
        a storage apparatus controller for controlling operation of the storage apparatus;
        an address register for storing a memory address; and
        a decoder for decoding a serial command received via the SPI, wherein when the serial command is a continuous read command, the SPI decoder reads a data from the storage apparatus based on the memory address and transmits the data to the SPI in a format complied with an SPI specification,
    wherein, the SPI decoder adds a last read address to a next record of address and updates the address register.

2. The slave of the serial peripheral interface (SPI) of claim 1, wherein the SPI decoder further comprises a pre-fetch data register, and the SPI decoder reads a data from the storage apparatus based on the next record of address updated to the address register, and stores the data to the pre-fetch data register.

3. The slave of the serial peripheral interface (SPI) of claim 1, wherein the SPI decoder decodes the serial command, and when the serial command is a continuous write command, the SPI decoder writes the data received via the SPI to the storage apparatus based on the memory address.

4. The slave of the serial peripheral interface (SPI) of claim 1, wherein the storage apparatus is a flash memory.

5. A master of a serial peripheral interface (SPI), comprising:
    a micro controller unit for providing a read address and receiving a read data; and
    an SPI controller electrically coupled to the micro controller unit, comprising:
        an address register for storing a reference address;
        a comparator electrically coupled to the address register for comparing the read address with the reference address and outputting a comparison value; and
        an encoder electrically coupled to the comparator, wherein when an address of a former read data is followed by the read address, the encoder generates a continuous read command based on the received comparison value, and the SPI controller transmits the continuous read command to the SPI and then waits for the read data to return; after the read data is returned, the SPI controller transmits the read data to the micro controller unit,
    wherein, after the addresses are compared, the SPI controller updates the address register based on the read address provided by the micro controller unit.

6. The master of the serial peripheral interface (SPI) of claim 5, wherein the micro controller unit provides a write address and transmits a write data.

7. The master of the serial peripheral interface (SPI) of claim 6, wherein the comparator outputs the comparison value to the encoder by comparing the write address with the reference address.

8. The master of the serial peripheral interface (SPI) of claim 6, wherein the encoder generates a continuous write command based on the received comparison value, and the SPI controller transmits the continuous write command to the SPI, wherein the continuous write command is followed by the write data provided by the micro controller unit.

9. A system of a serial peripheral interface (SPI), comprising:
    a serial peripheral interface (SPI);
    a master of the SPI, comprising:
        a micro controller unit for providing a read address and receiving a read data; and
        an SPI controller electrically coupled to the micro controller unit, comprising:
            a first address register for storing a reference address;
            a comparator electrically coupled to the first address register for comparing the read address with the reference address and outputting a comparison value; and
            an encoder electrically coupled to the comparator, wherein when an address of a former read data is followed by the read address, the encoder generates a continuous read command based on the received comparison value, and the SPI controller transmits the continuous read command to the SPI and then waits for the read data to return,
        wherein, after the addresses are compared, the SPI controller updates the first address register based on the read address provided by the micro controller unit; and
    a slave of the serial peripheral interface (SPI), comprising:
        a storage apparatus for providing a data; and
        an SPI decoder electrically coupled to the storage apparatus, comprising:
            a storage apparatus controller for controlling operation of the storage apparatus;
            a second address register for storing a memory address; and
            a decoder for decoding a serial command received via the SPI, wherein when the serial command equals a continuous read command, the SPI decoder reads a data from the storage apparatus based on the memory address and transmits the data to the SPI in a format complied with an SPI specification; wherein the SPI decoder adds a last read address to a next record of address and updates the second address register,
    finally, when the read data is returned, the SPI controller transmits the read data to the micro controller unit.

10. The system of the serial peripheral interface (SPI) of claim 9, wherein the SPI decoder further comprises a pre-fetch data register, and the SPI decoder reads a data from the storage apparatus based on the next record of address updated to the second address register, and stores the data to the pre-fetch data register.

11. The system of the serial peripheral interface (SPI) of claim 9, wherein the storage apparatus is a flash memory.

12. A method for operating a serial peripheral interface (SPI), comprising:
    storing a memory address;
    receiving a serial command;
    decoding the received serial command;

when the serial command equals a continuous read command, read the data based on the memory address, and returning the read command in a format complied with an SPI specification; and adding a last read address to a next record of address and updating the memory address.

13. The method for operating the serial peripheral interface (SPI) of claim 12, further comprising:

storing a reference address;

providing a read address;

comparing the read address with the reference address and outputting a comparison value;

when an address of a former read data is followed by the read address, generating the continuous read command based on the received comparison value;

transmitting the continuous read command and waiting for the read data to return;

when the read data is returned, transmitting the read data to a place where it is from; and after the addresses are compared, updating the reference address based on the read address.

14. The method for operating the serial peripheral interface (SPI) of claim 13, further comprising:

providing a write address and transmitting a write data;

generating a continuous write command, and transmitting the continuous write command and the write data, wherein the continuous write command is followed by the write data; and when the serial command equals the continuous write command, write the received write data to the storage apparatus based on the memory address.

15. The method for operating the serial peripheral interface (SPI) of claim 14, before the step of generating the continuous write command, further comprising:

comparing the write address with the reference address and outputting a comparison value, wherein the continuous write command is generated based on the comparison value.

* * * * *